(12) United States Patent
McCreery

(10) Patent No.: US 7,141,299 B2
(45) Date of Patent: Nov. 28, 2006

(54) ELECTRONIC JUNCTION DEVICES FEATURING REDOX ELECTRODES

(75) Inventor: Richard L. McCreery, Worthington, OH (US)

(73) Assignee: The Ohio State University Research Foundation, Columbus, OH (US)

( * ) Notice: Subject to any disclaimer, the term of this patent is extended or adjusted under 35 U.S.C. 154(b) by 236 days.

(21) Appl. No.: 10/795,904

(22) Filed: Mar. 8, 2004

(65) Prior Publication Data

US 2005/0139254 A1 Jun. 30, 2005

Related U.S. Application Data

(63) Continuation-in-part of application No. 09/755,437, filed on Jan. 5, 2001, and a continuation-in-part of application No. 10/376,865, filed on Feb. 28, 2003, now Pat. No. 6,855,950.

(51) Int. Cl.
*B32B 15/04* (2006.01)
*B32B 15/20* (2006.01)
*B32B 18/00* (2006.01)
*B32B 33/00* (2006.01)

(52) U.S. Cl. .................. 428/333; 428/411.1; 428/457; 428/702

(58) Field of Classification Search ............. 428/411.1, 428/457, 702, 333
See application file for complete search history.

(56) References Cited

U.S. PATENT DOCUMENTS

| | | | |
|---|---|---|---|
| 4,599,705 A | 7/1986 | Holmberg et al. | 365/163 |
| 5,521,423 A | 5/1996 | Shinriki et al. | 257/530 |
| 6,111,302 A | 8/2000 | Zhang et al. | 257/530 |
| 6,128,214 A | 10/2000 | Kuekes et al. | 365/151 |
| 6,198,655 B1 | 3/2001 | Heath et al. | 365/151 |
| 6,208,553 B1 | 3/2001 | Gryko et al. | 365/151 |
| 6,314,019 B1 | 11/2001 | Kuekes et al. | 365/151 |
| 6,324,091 B1 | 11/2001 | Gryko et al. | 365/151 |
| 6,381,169 B1 | 4/2002 | Bocian et al. | 365/151 |
| 6,459,095 B1 | 10/2002 | Heath et al. | 257/14 |
| 6,657,884 B1 | 12/2003 | Bocian et al. | 365/151 |
| 6,661,691 B1 | 12/2003 | Fricke et al. | 365/63 |
| 6,674,121 B1 | 1/2004 | Misra et al. | 257/324 |
| 6,855,950 B1 * | 2/2005 | McCreery | 257/40 |

OTHER PUBLICATIONS

Zhou et al., Appl. Phys. Lett. 71 (5), pp. 611-613, Aug. 1997.*

* cited by examiner

*Primary Examiner*—Ramsey Zacharia
(74) *Attorney, Agent, or Firm*—Standley Law Group LLP

(57) ABSTRACT

An electronic junction of the present invention comprises: (a) a first conductive component comprising: (i) a substrate having a contact surface; and (ii) at least one layer of molecular units having first and second ends, wherein at least one layer of molecular units is attached through their first ends to the contact surface through a type of association selected from the group consisting of: covalent bonding and strong electronic coupling; and (b) a second conductive component in electrical contact with the second ends of at least one layer of molecular units, the second conductive component comprising at least one metal and at least one metal oxide, wherein at least one conductive component in electronic junction has an electrical property that changes in response to a stimulus.

15 Claims, 7 Drawing Sheets

ELECTRONIC JUNCTION DEVICES FEATURING REDOX ELECTRODES

The present application is a continuation-in-part of U.S. patent application Ser. No. 09/755,437, filed Jan. 5, 2001, now allowed, which is incorporated herein by reference. The present application is a continuation-in-part of U.S. patent application Ser. No. 10/376,865, filed Feb. 28, 2003, now U.S. Pat. No. 6,855,950, which is incorporated herein by reference.

TECHNICAL FIELD OF THE INVENTION

The present invention is in the field of molecular electronics, a subset of the general field of microelectronics. Specifically, the present invention is in the field of electronic junction devices.

BACKGROUND OF THE INVENTION

A central effort in the field of molecular electronics has been the investigation of molecules as rectifiers, switches, storage devices, etc., in microelectronic applications. The goal of the present invention is to provide a means to alter junction conductivity via a chemical change induced by an electrical stimulus.

In view of the present disclosure or through practice of the present invention, other advantages may become apparent.

SUMMARY OF THE INVENTION

In general terms, the present invention includes an electronic junction comprising: (a) a first conductive component comprising: (i) a substrate having a contact surface; and (ii) at least one layer of molecular units having first and second ends, wherein at least one layer of molecular units is attached through their first ends to said contact surface through a type of association selected from the group consisting of: covalent bonding and strong electronic coupling; and (b) a second conductive component in electrical contact with said second ends of at least one layer of molecular units, said second conductive component comprising at least one metal and at least one metal oxide, wherein at least one said conductive component in said electronic junction has an electrical property that changes in response to a stimulus.

In one embodiment of the electronic junction, the electronic junction has a thickness in the range of from about 1 to 20 nanometers. In another embodiment, the electronic junction has a thickness in the range of from about 5 to about 200 nanometers.

In one embodiment of the electronic junction, at least one layer of molecular units comprises a chemical structure capable of being changed from a relatively non-conductive state to a relatively conductive state by the application of a stimulus. Examples of suitable stimuli for changing the chemical structure include but are not limited to an applied voltage and which results in a redox reaction.

In one embodiment of the electronic junction, the second conductive component is capable of storing a charge.

In one embodiment of the electronic junction, the chemical structure comprises at least one aromatic group when in said relatively non-conductive state.

In yet another embodiment, the chemical structure is selected from the group consisting of: substituted phenyl groups, unsubstituted phenyl groups, substituted benzyl groups, unsubstituted benzyl groups, substituted phenolic groups unsubstituted phenolic groups, substituted metalloporphyrin rings, unsubstituted metalloporphyrin rings, substituted ferrocene groups and unsubstituted ferrocene groups. In an alternative embodiment, the chemical structure is selected from the group consisting of: biphenyl groups, fluorene groups, anthracene groups, phenanthrene groups, polyphenylene groups, polynuclear aromatic hydrocarbon groups, nitrated biphenyl groups, azobenzyl groups, and nitroazobenzyl groups.

In one embodiment, the molecular units are chemically bonded to the contact surface of the substrate by a chemical bond having the formula: R—X, wherein R is a metal, silicon or carbon atom of the substrate and X is an oxygen or carbon atom of the molecular unit.

In yet another embodiment, the first conductive component comprises electrically conductive carbon.

In one embodiment the molecular units of a given layer are substantially the same length.

In another embodiment, the second conductive component is chemically bound to the second ends of at least one layer of molecular units.

In one embodiment, the molecular units in at least one layer are substantially parallel to one another.

In one embodiment, at least some of the molecular units form an arrangement of molecular orbitals such that the electronic junction is capable of functioning as a semiconductor.

In one embodiment, the metal is selected from the group consisting of: titanium, silver, gold, tungsten, and copper.

In one embodiment, the metal oxide is selected from the group consisting of: titanium oxide, silver oxide, gold oxide, tungsten oxide, and copper oxide.

In one embodiment, the electronic junction is devoid of electrolytic solution.

In one embodiment, the electronic junction is devoid of liquid.

In another embodiment, the second conductive component additionally comprises at least one ion.

The present invention also includes an electronic junction comprising: (a) a first conductive component comprising: (i) a substrate having a contact surface; and (ii) at least one layer of molecular units having first and second ends, wherein at least one layer of molecular units are attached by their first ends to the contact surface through a type of association selected from the group consisting of: covalent bonding and strong electronic coupling; and (b) a second conductive component comprising: (i) a substrate having a contact surface; and (ii) at least one layer of molecular units having first and second ends, wherein at least one said layer of molecular units are attached by their first ends to the contact surface through a type of association selected from the group consisting of: covalent bonding and strong electronic coupling, wherein at least one layer of molecular units of the electronic junction has an electrical property that changes in response to a stimulus, and wherein the first conductive component and the second conductive component are in sufficient proximity to one another that the first conductive component and the second conductive component are in electrical communication.

In one embodiment, the chemical structure of the layer of first conductive component comprises at least one aromatic group when in the relatively non-conductive state.

In another embodiment, the layer of second conductive component comprises at least one aromatic group when in the relatively non-conductive state.

In one embodiment the chemical structure is selected from the group consisting of: substituted phenyl groups, unsubstituted phenyl groups, substituted benzyl groups, unsubstituted benzyl groups, substituted phenolic groups unsubstituted phenolic groups, substituted metalloporphyrin rings, unsubstituted metalloporphyrin rings, substituted ferrocene groups and unsubstituted ferrocene groups.

In yet another embodiment, the chemical structure is selected from the group consisting of: substituted phenyl groups, unsubstituted phenyl groups, substituted benzyl groups, unsubstituted benzyl groups, substituted phenolic groups and unsubstituted phenolic groups.

In one embodiment, the chemical structure is selected from the group consisting of: biphenyl groups, fluorene groups, anthracene groups, phenanthrene groups, polyphenylene groups, polynuclear aromatic hydrocarbon groups, nitrated biphenyl groups, azobenzyl groups, and nitroazobenzyl groups.

In another embodiment, the chemical structure is selected from the group consisting of: biphenyl groups, nitrated biphenyl groups, and azobenzyl groups.

In one embodiment, the molecular units are chemically bonded to the contact surface of the substrate of the first conductive component by a chemical bond having the formula: R—X wherein R is a metal, silicon or carbon atom of the substrate and X is an oxygen or carbon atom of the molecular unit.

In another embodiment, the molecular units are chemically bonded to the contact surface of the substrate of the second conductive component by a chemical bond having the formula: R—X wherein R is a metal, silicon or carbon atom of the substrate and X is an oxygen or carbon atom of the molecular unit.

In one embodiment, the substrate of the first conductive component comprises electrically conductive carbon.

In one embodiment, the substrate of the second conductive component comprises electrically conductive carbon.

In one embodiment, at least one layer of molecular units comprises molecular units that are substantially parallel to one another.

In another embodiment, at least some of said molecular units form an arrangement of molecular orbitals such that the electronic junction is capable of functioning as a semiconductor.

In another embodiment, the electronic junction is devoid of electrolytic solution.

In another embodiment, the electronic junction is devoid of liquid.

In one embodiment, the second conductive component additionally comprises at least one ion.

DETAILED DESCRIPTION OF THE PREFERRED EMBODIMENT(S)

In accordance with the foregoing summary of the invention, the following presents a detailed description of the preferred embodiment of the invention which is presently considered to be its best mode.

Molecular junctions with a 3.7 nm thick NAB film were fabricated on pyrolyzed photoresist films (PPF) with the procedure described by McCreery et al. in the Journal of American Chemical Society 2003, volume 125, pp 10748–10758, with an important exception. For the samples designated as "low oxide," the electron beam evaporation chamber pressure was decreased to ~4×10$^{-7}$ torr instead of the previous 8×10$^{-6}$ torr, and the initial Ti deposition rate was increased to 0.1 nm/sec compared to the previous 0.03 nm/sec. Based on the assumption that the residual gas is air, and that each collision of $O_2$ with the Ti surface is reactive, the reduction in residual pressure and increased deposition rate should decrease the deposited O/Ti mole ratio from 12.8 to 0.19. Therefore, we predict that the initial 3.0 nm of Ti deposited under the conditions cited in the Journal of American Chemical Society paper cited above is mostly or entirely titanium oxide, and the resulting junctions will be referred to as "high oxide." It is important to note that "high oxide" and "low oxide" PPF/NAB(3.7)/Ti junctions are identical except for Ti deposition conditions, with identical PPF substrate, 3.7 nm thick NAB layer, and protective gold layer. In both cases, the initial slow deposition of Ti was followed by faster Ti deposition at 1.0 nm/sec, up to a total Ti thickness of 50 nm.

The presence of Ti oxide was confirmed with X-ray photoelectron spectroscopy (XPS) depth profiling of a PPF/azobenzene/Ti/Au molecular junction. Azobenzene was used instead of NAB, so the molecule did not contribute oxygen, but the metal deposition conditions were identical to the "high oxide" case. After insertion in the XPS chamber, the metal layers were sputtered with $Ar^+$ ions and XPS spectra were acquired periodically. Various Ti oxides were observed, including TiO (Ti $2p_{3/2}$ peak at 455 eV), $Ti_2O_3$ (456 eV), but very little $TiO_2$ (459 eV). Since Ti deposition occurred at room temperature, the Ti oxide layer is likely to be disordered, and will be referred to as "$TiO_x$."

Figure 2:
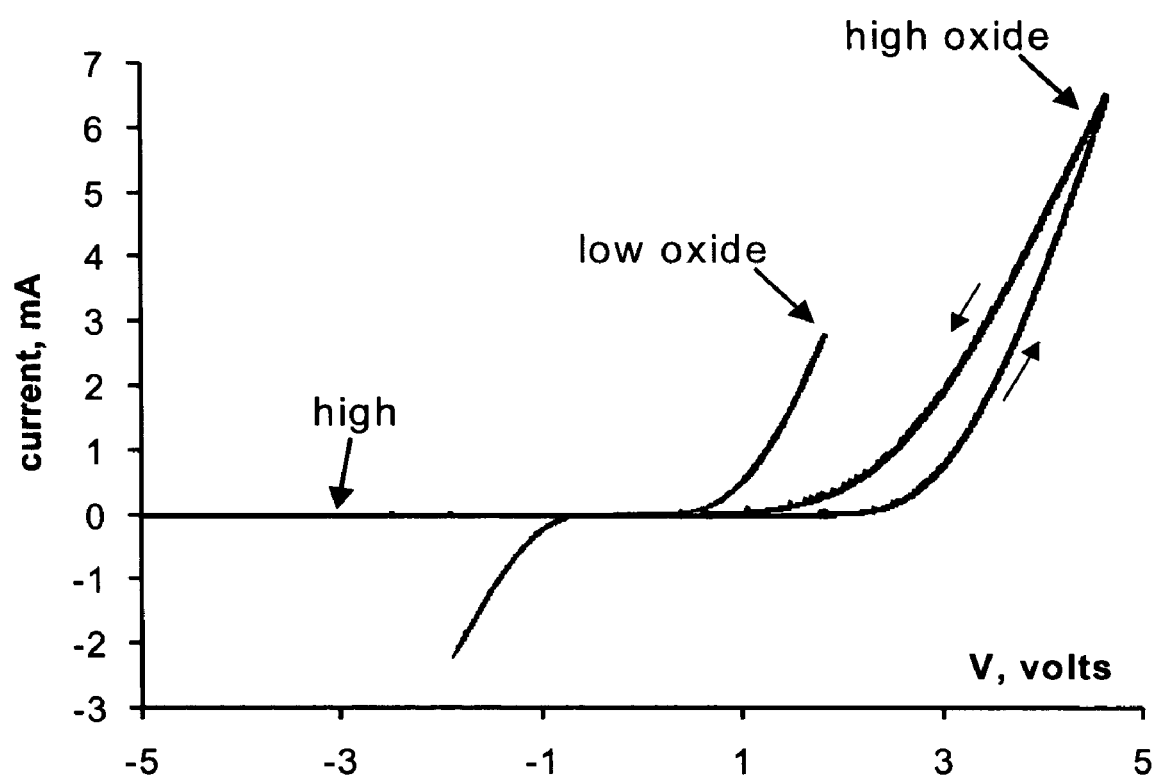
FIG. 2 provides the current/voltage curves for carbon/NAB/titanium junctions prepared under "high oxide" and "low oxide" conditions. The scan rate was 1 V/sec. The arrows for the high oxide case indicate the scan direction.
Figure 3:
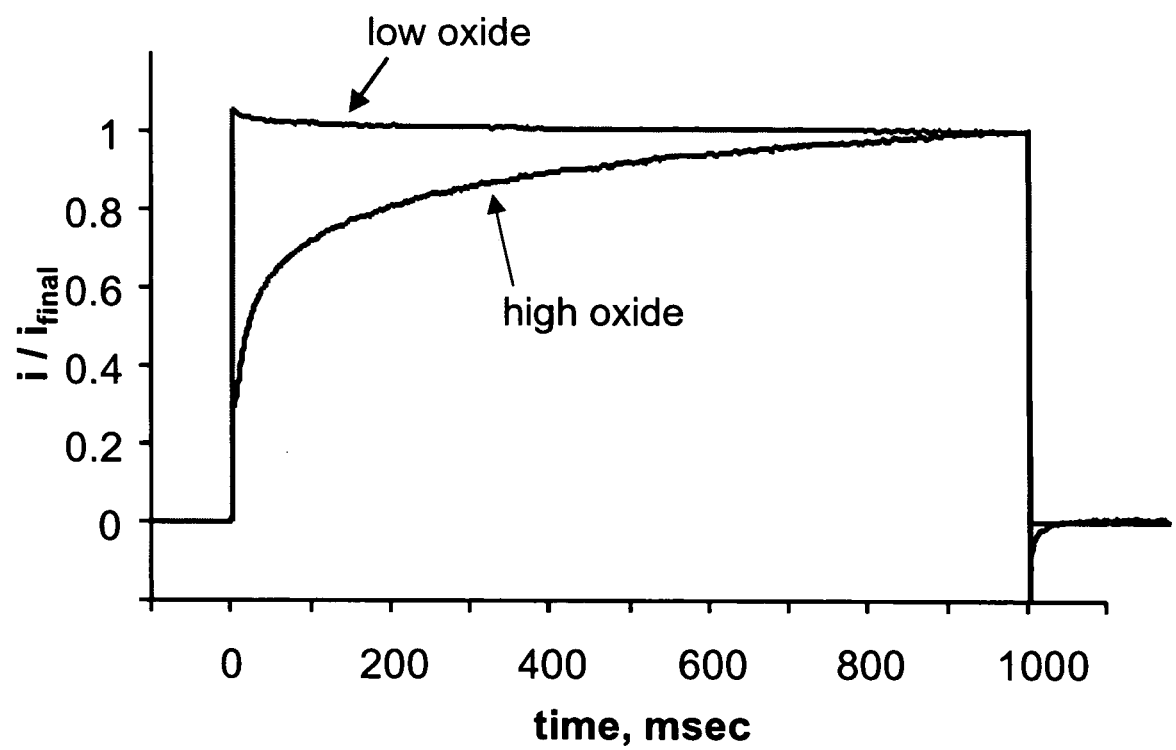
FIG. 3 illustrates the current response to a one-second potential pulse from 0 V to +2 V (carbon positive) for high and low oxide junctions. Current was normalized by the value at the end of the +2 V potential excursion. Actual final current densities at 1000 msec were 1.57 A/cm$^2$ for low oxide and 0.0062 A/cm$^2$ for high oxide.

FIG. 2 compares current/voltage (i/V) curves for PPF/NAB(3.7)/Ti junctions prepared identically except for Ti deposition conditions. The "low oxide" case has much higher current, lower resistance, and less hysteresis than the "high oxide" case. Note also that the rectification observed for the high oxide case is absent for the low oxide junction. For eight "low oxide" junctions on two separate samples, the resistance (±50 mV voltage range) was 284±75 ohm–cm$^2$, compared to 4.1 MΩ–cm$^2$ for the "high oxide" case. The junction capacitance was higher for the low oxide case: 1.2

μF/cm² compared to 0.5 μF/cm² at 1000 V/sec. FIG. 3 shows the current vs. time response for a potential step to +2 volts (carbon relative to Ti). The current scale is normalized to the final current ($i_{final}$) in order to compare curve shapes, but the final current at +2 V for the low oxide case was much higher (1.57 A/cm²) than for the high oxide case (0.0062 A/cm²). The rise time of the low oxide transient was fast (<5 μsec) compared to the slow response for the high oxide case evident in FIG. 3 (>100 msec).

Figure 4:
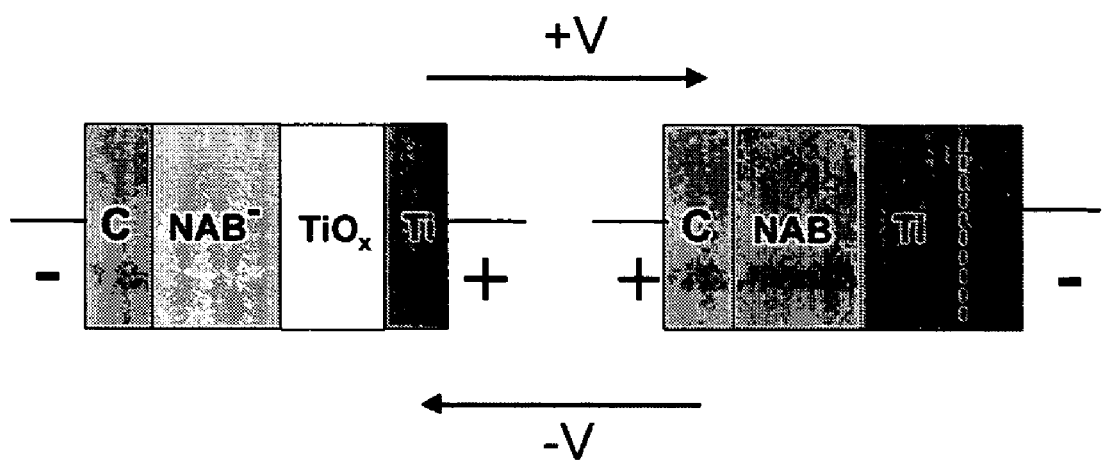
FIG. 4 presents a redox cell comprising the molecular junction of the present invention. The redox cell reduces $TiO_x$ to Ti metal and oxidizes an organic anion to its neutral form. The specific redox reactions are quite variable, and not limited to the organic and metal oxide cases illustrated.

The existence of $TiO_x$ in the molecular junction and its strong effect on electronic behavior imply that a previously unrecognized phenomenon may be important to the conductance switching reported by our lab and several others. We proposed previously that NAB is partially reduced to NAB⁻ in the junction, either by an applied potential or by Ti atoms during deposition. The present results indicate that a $Ti/TiO_x$ redox couple may also be present. As illustrated in FIG. 4, the junction becomes an electrochemical cell comprised of a NAB/NAB⁻ half cell and a $Ti/TiO_x$ half cell, denoted as follows:

PPF|NAB⁻, NAB ||TiO$_x$/Ti

When +2 volts is applied, as in FIG. 3, the PPF is positive relative to Ti, so NAB⁻ is oxidized to NAB, and $TiO_x$ is reduced to Ti. Since titanium in oxidation state II and III was observed in the junction, the Ti redox reaction may also involve Ti/Ti⁺, Ti(II)/Ti(III) and associated oxides, including $TiO_2$. The junction is acting as an electrolytic cell, with the kinetics, hysteresis, and temperature dependence expected for such a process, and reported previously. The lower capacitance, higher resistance, and slow response of the high oxide junctions are all consistent with the presence of a partially insulating $TiO_x$ layer, which effectively increases the distance between the Ti and carbon conductors.

A major consequence of a $TiO_x/Ti$ half cell is the formation of metallic Ti when the Ti is negative relative to the PPF. Presumably this Ti is interspersed with $TiO_x$, but at some point it will form conducting pathways between bulk Ti metal and the NAB layer. In the limit of total conversion of $TiO_x$ to Ti metal, we expect the i/V curve to approach that of an NAB(3.7) junction which contains negligible $TiO_x$. In fact, upon application of +4 V for 5 seconds, the current for a high oxide PPF/NAB(3.7)/Ti junction increases from <0.01 A/cm² to 0.4 A/cm², while the low oxide case shows 1.6 A/cm² at 2 V. Therefore, reduction of $TiO_x$ to Ti in a high oxide junction indeed results in a junction behavior approaching that of the "low oxide" case. The rectification apparent in FIG. 2 for the high oxide case is consistent with $TiO_x$ reduction for positive applied voltage, to form Ti metal and result in decreased resistance. For negative applied voltages (Ti positive), oxidation of Ti to $TiO_x$ forms an insulating film, and the observed current is decreased dramatically. The net effect of the applied voltage is the generation of Ti and NAB when the carbon is positive of Ti, and $TiO_x$ and NAB anion radical when carbon is negative.

The importance of Ti formation from a $TiO_x/Ti$ redox couple lies in the role of metallic Ti in "conductance switching." Ti formation by a redox couple would be expected to be chemically reversible and repeatable many times, although with relatively slow kinetics and strong temperature dependence. The conductivity of the molecular layer should also depend on the molecule's redox state, so that both the molecule and $TiO_x$ half-cells may change electronic properties with an applied potential. In the general case, the conductance of the junction depends on the composition of the entire "cell", with both half reactions contributing to the observed conductivity. The fact that conductance switching has been observed without Ti present indicates that there must be switching mechanisms in molecular junctions which do not involve $Ti/TiO_x$ redox chemistry. Such mechanisms were reported in two previous applications, which dealt with the conductance changes in the organic layer. However, when Ti or other reactive metals (e.g. Al) are used for top contacts, the consequences of oxide formation must be considered. The involvement of $Ti/TiOx$, or any other redox system in the second layer of the device adds flexibility to the junction in addition to that described in previous applications. A few examples are given below.

Figure 5:
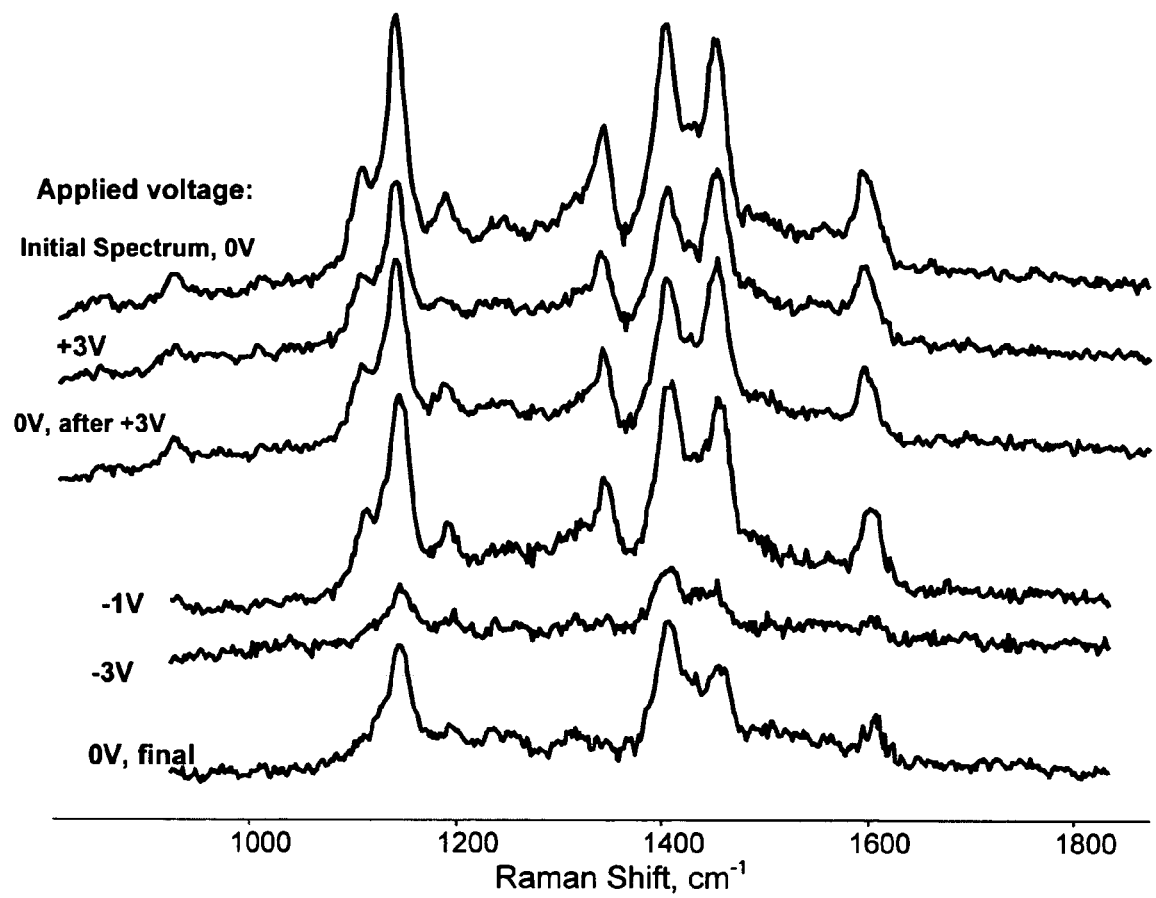
FIG. 5 compares various Raman spectra of a carbon/NAB/$TiO_x$/Ti/Au junction under bias. Changes in the spectrum with applied voltage indicate changes in chemical structure in response to applied voltage.

The existence of chemical changes within the carbon/NAB/TiOx/Ti/Au molecular junction is demonstrated in FIG. 5, which shows Raman spectra obtained from the active junction through a partially transparent Ti/Au top contact. Raman spectroscopy reveals molecular vibrations, and is a sensitive indicator of molecular structure. The Raman spectral changes unequivocally indicate that molecular rearrangement occurs in response to the applied voltage. Some of these changes are reversible and repeatable, indicating that the junction may be repeatedly cycled between states with distinct structures and electrical properties.

Figure 1A:
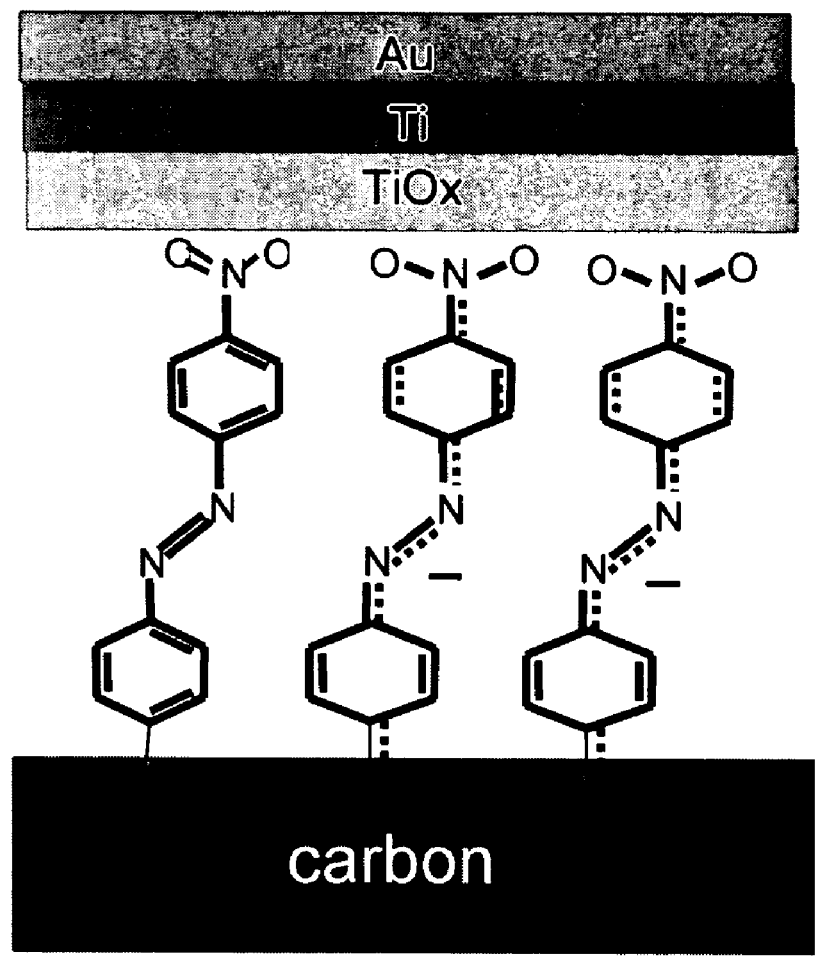
FIG. 1a illustrates the "high oxide" state for one embodiment of the present invention. The titanium and titanium oxide may be intermixed or layered, and may contain titanium in a range of oxidation states from (0) to (IV).
Figure 1B:
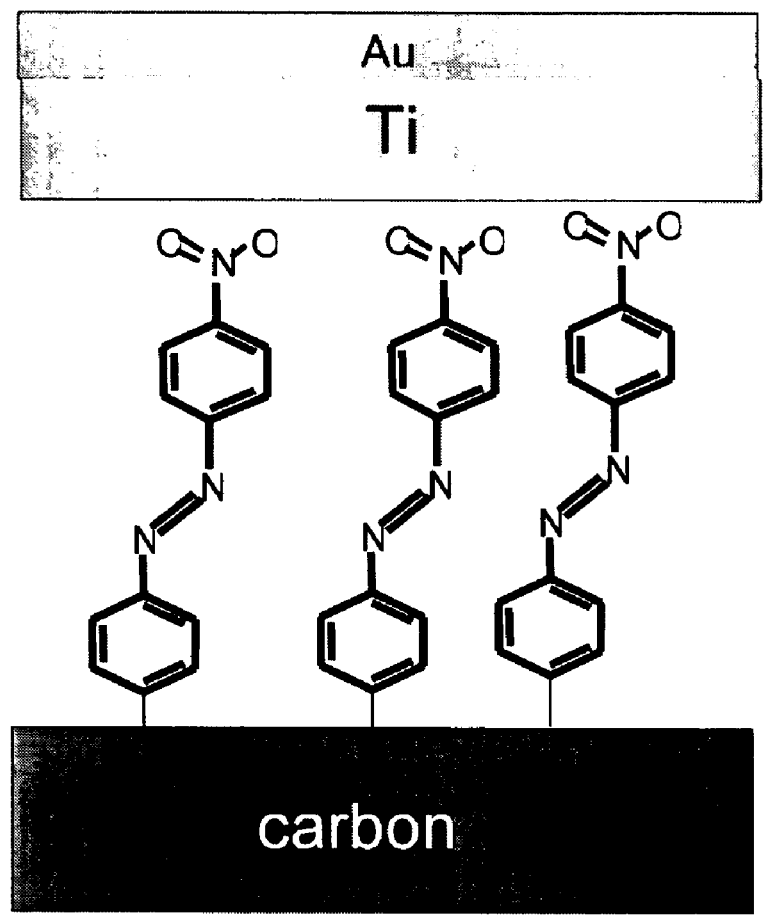
FIG. 1b illustrates the "low oxide" state for one embodiment of the present invention. The junction shown consists of NAB and Ti(0), but also may contain small amounts of $Ti^+$ and/or $NAB^-$.

The process of controlling the redox state of the junction with an applied voltage illustrated by FIG. 4 and verified by FIG. 5 serves as a good example of how the invention might be used in microelectronic applications. The NAB/Ti state (see FIG. 1b) has a different conductivity than the NAB⁻/TiOx state (FIG. 1a), and this difference can be determined by a small applied voltage. The conductivities may differ for several reasons, such as a decreased tunneling barrier between the conductive contacts, the decrease in tunneling distance caused by the formation of Ti metal from TiOx, or inherent differences in the resistivities of the materials in the two states. In addition to monitoring conductivity, the charge on the NAB may be sensed; as can its optical properties. The two states may last for several minutes or longer, thus providing a means to store information.

Although two redox pairs acting together is the familiar basis of common batteries, the present invention has distinctive differences. A battery has bulk electrode and electrolyte phases, whereas the present invention uses near monolayers of a few layers of active agents. Thus the active region of the redox cell is very thin, about 1–20 nm. Batteries rely solely on ionic conduction in the electrolyte, while the present invention permits electronic conduction, e,g, by titanium formed from TiOx. If such conduction occurred in a conventional battery, it would fail completely and be discarded. Furthermore, the electronic conduction and charge state of the present invention may both (separately or together) be the basis of an electronic function in a microelectronic circuit. Although the present invention may indeed act as a battery in certain circumstances, the main applications involve changes in the electronic properties of the various phases in response to an electrical stimulus, and the exploitation of those electronic properties to perform a useful electronic function.

Figure 6:
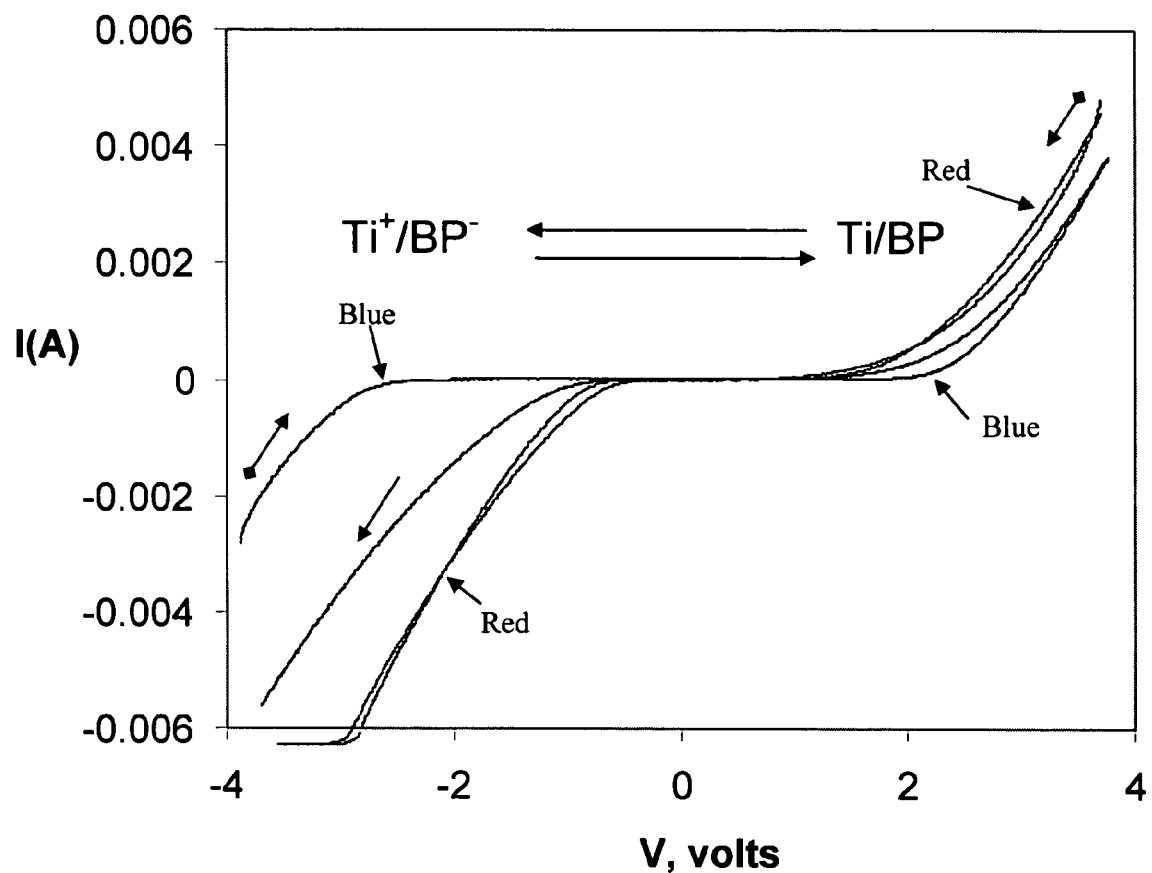
FIG. 6 provides current/voltage curves for a carbon/biphenyl/titanium/gold junction.

FIG. 6 presents the current/voltage response for a redox pair which does not depend on a metal oxide, to illustrate that the invention is not restricted to junctions containing metal oxide. A carbon/biphenyl/titanium/gold junction was prepared in conditions which greatly diminished the Ti oxide level. For a scan started at +3 volts, the red curve is the i/V response of the biphenyl/Ti junction, and both the Ti and biphenyl are in their neutral forms. The blue curve was started after applying a potential of −3 V, which converted the junction at least partially to BP⁻ and Ti⁺. This junction has lower conductivity than BP/Ti, hence the smaller current.

When the BP⁻/Ti⁺ junction was scanned into positive potentials, it was partially converted to BP/Ti, causing the increased current on the return scan to negative potentials. This experiment illustrates not only the difference in conductivity between the two states, but also the transition from one state to another, at positive voltage in this case. In an alternative embodiment of the invention, the Ti/Ti⁺ or Ti/TiO$_x$ redox system may be an organic redox pair, which accepts or donates electrons to accompany the complementary redox reaction represented by the NAB/NAB⁻ redox pair in the example.

In view of the present disclosure or through practice of the present invention, it will be within the ability of one of ordinary skill to make modifications to the present invention, such as through the use of equivalent arrangements and compositions, in order to practice the invention without departing from the spirit of the invention as reflected in the appended claims.

What is claimed is:

1. A solid-state electronic junction comprising:
   a first conductive component, said first conductive component comprising:
     a substrate having a contact surface; and
     at least one layer of molecular units having first and second ends, wherein
     at least one layer of molecular units is attached through their first ends to
     said contact surface through a type of association selected from the group consisting of: covalent bonding and strong electronic coupling; and
   a second conductive component comprising a layer of at least one metal and at least one metal oxide adjacent to, and in electrical communication with, said second ends of said at least one layer of said molecular units, said layer of at least one metal and at least one metal oxide having a conductance that reversibly changes in response to a reduction-oxidation reaction occurring between said layer of at least one metal and at least one metal oxide and said at least one layer of molecular units when a voltage is applied across said electronic junction, wherein said electronic junction is devoid of electrolytic solution.

2. The electronic junction according to claim 1 wherein at least one said layer of molecular units comprises a chemical structure capable of being changed from a relatively non-conductive state to a relatively conductive state by the application of a stimulus.

3. The electronic junction according to claim 1 wherein said second conductive component is capable of storing a charge.

4. The electronic junction according to claim 1 wherein said chemical structure comprises at least one aromatic group when in said relatively non-conductive state.

5. The electronic junction according to claim 4 wherein said chemical structure is selected from the group consisting of: substituted phenyl groups, unsubstituted phenyl groups, substituted benzyl groups, unsubstituted benzyl groups, substituted phenolic groups, unsubstituted phenolic groups, substituted metalloporphyrin rings, unsubstituted metalloporphyrin rings, substituted ferrocene groups and unsubstituted ferrocene groups.

6. The electronic junction according to claim 4 wherein said chemical structure is selected from the group consisting of: biphenyl groups, fluorene groups, anthracene groups, phenanthrene groups, polyphenylene groups, polynuclear aromatic hydrocarbon groups, nitrated biphenyl groups, azobenzyl groups, and nitroazobenzyl groups.

7. The electronic junction according to claim 4 wherein said molecular units are chemically bonded to said contact surface of said substrate by a chemical bond having the formula:

R—X wherein R is a metal, silicon or carbon atom of said substrate and X is an oxygen or carbon atom of said molecular unit.

8. The electronic junction according to claim 1 wherein said first conductive component comprises electrically conductive carbon.

9. The electronic junction according to claim 1 wherein said molecular units of a given layer are substantially the same length.

10. The electronic junction according to claim 1 wherein said second conductive component is chemically bound to said second ends of at least one layer of molecular units.

11. The electronic junction according to claim 1 wherein said molecular units in at least one layer are substantially parallel to one another.

12. The electronic junction according to claim 1 wherein at least some of said molecular units form an arrangement of molecular orbitals such that said electronic junction is capable of functioning as a semiconductor.

13. The electronic junction according to claim 1 wherein said metal is selected from the group consisting of: titanium, silver, gold, tungsten, and copper.

14. The electronic junction according to claim 1 wherein said metal oxide is selected from the group consisting of: titanium oxide, silver oxide, gold oxide, tungsten oxide, and copper oxide.

15. The electronic junction according to claim 1 wherein said second conductive component additionally comprises at least one ion.

* * * * *

UNITED STATES PATENT AND TRADEMARK OFFICE
CERTIFICATE OF CORRECTION

PATENT NO. : 7,141,299 B2 Page 1 of 1
APPLICATION NO. : 10/795904
DATED : November 28, 2006
INVENTOR(S) : McCreery It is certified that error appears in the above-identified patent and that said Letters Patent is hereby corrected as shown below:

In column 2, line 12, please delete "R-X" and insert -- R----X --.

In column 3, line 23, please delete "R-X" and insert -- R----X --.

In column 3, line 29, please delete "R-X" and insert -- R----X --.

In column 8, line 23, please delete "R-X" and insert -- R----X --.

Signed and Sealed this

Thirteenth Day of February, 2007

JON W. DUDAS
*Director of the United States Patent and Trademark Office*